(12) United States Patent
Stancavage et al.

(10) Patent No.: US 11,637,410 B2
(45) Date of Patent: Apr. 25, 2023

(54) VEHICLE COMPONENT WITH AN ACCESSORY MOUNTING FEATURE AND A METHOD AND TOOL FOR FORMING

(71) Applicant: Ford Global Technologies, LLC, Dearborn, MI (US)

(72) Inventors: Jeffrey Stancavage, Chesterfield Township, MI (US); Sandra Davidson Osip, Livonia, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 126 days.

(21) Appl. No.: 17/019,776

(22) Filed: Sep. 14, 2020

(65) Prior Publication Data

US 2020/0412096 A1 Dec. 31, 2020

Related U.S. Application Data

(62) Division of application No. 15/887,202, filed on Feb. 2, 2018, now Pat. No. 10,808,657.

(51) Int. Cl.
*H01S 5/20* (2006.01)
*G02B 6/122* (2006.01)
(Continued)

(52) U.S. Cl.
CPC ......... *H01S 5/2031* (2013.01); *F02M 35/104* (2013.01); *F02M 35/1034* (2013.01); *F02M 35/10249* (2013.01); *G02B 6/1225* (2013.01); *G02F 1/035* (2013.01); *H01S 5/0206* (2013.01); *H01S 5/041* (2013.01); *H01S 5/1046* (2013.01);
(Continued)

(58) Field of Classification Search
CPC ...... H01S 5/2031; H01S 5/0206; H01S 5/041; H01S 5/1046; H01S 5/341; H01S 5/187; H01S 5/18; H01S 5/06; H01S 5/10; F02M 35/10249; F02M 35/1034; F02M 35/104; G02B 6/1225; G02F 1/035; G02F 2203/10; B29C 45/14344; B29C 45/33; B29C 45/44; B29L 2031/7492
See application file for complete search history.

(56) References Cited

U.S. PATENT DOCUMENTS 3,068,520 A 12/1962 Hehl
3,136,001 A 6/1964 Gelbard
(Continued)

OTHER PUBLICATIONS

Lanxess, Engineering Plastics Part and Mold Design, A Design Guide, (2007) Lanxess Corporation, p. 30 (Year: 2007).*

*Primary Examiner* — Kurt Philip Liethen
(74) *Attorney, Agent, or Firm* — Brooks Kushman P.C.; Vincent Mastrogiacomo

(57) ABSTRACT

A vehicle component, and a method and tool for forming the component are provided. First and second tools with first and second surfaces, respectively, are provided. The first tool is translated along a first axis towards the second tool such that the first and second surfaces cooperate to define a mold cavity configured to form an accessory mount feature with an aperture. The second surface is configured to form an integrated rib extending outwardly from an upper surface of the mount feature to a planar bearing surface surrounding the aperture with the planar bearing surface oriented at an acute angle relative to the upper surface. The first axis is substantially parallel to the upper surface.

20 Claims, 4 Drawing Sheets

(51) Int. Cl.
   *G02F 1/035* (2006.01)
   *H01S 5/34* (2006.01)
   *H01S 5/02* (2006.01)
   *H01S 5/04* (2006.01)
   *H01S 5/10* (2021.01)
   *F02M 35/10* (2006.01)
   *F02M 35/104* (2006.01)
   *B29C 45/14* (2006.01)
   *B29L 31/00* (2006.01)
   *B29C 45/44* (2006.01)
   *B29C 45/33* (2006.01)

(52) U.S. Cl.
   CPC ........ *H01S 5/341* (2013.01); *B29C 45/14344* (2013.01); *B29C 45/33* (2013.01); *B29C 45/44* (2013.01); *B29L 2031/7492* (2013.01); *G02F 2203/10* (2013.01)

(56) References Cited

U.S. PATENT DOCUMENTS

| | | | |
|---|---|---|---|
| 3,330,019 | A | 7/1967 | Carlson et al. |
| 3,751,109 | A | 8/1973 | Dufton |
| 3,773,454 | A | 11/1973 | Horve et al. |
| 4,005,961 | A | 2/1977 | Manceau |
| 4,502,660 | A | 3/1985 | Luther et al. |
| 4,630,160 | A | 12/1986 | Murayama |
| 4,692,108 | A | 9/1987 | Cesano |
| 5,028,230 | A | 7/1991 | Hunter |
| 5,209,191 | A | 5/1993 | Kopec |
| 5,238,387 | A | 8/1993 | Hama et al. |
| 5,243,933 | A | 9/1993 | Mukawa |
| 5,324,151 | A | 6/1994 | Szudarek et al. |
| 5,339,491 | A | 8/1994 | Sims |
| 5,356,590 | A | 10/1994 | Melanson |
| 5,616,891 | A | 4/1997 | Fumey |
| 5,642,697 | A | 7/1997 | Jahrens et al. |
| 5,806,139 | A | 9/1998 | Anderson et al. |
| 5,839,404 | A * | 11/1998 | Numata ........... F02M 35/10295 123/184.34 |
| 5,908,643 | A | 6/1999 | Yost et al. |
| 5,924,634 | A | 7/1999 | Arndt et al. |
| 5,928,453 | A | 7/1999 | Kawamoto |
| 5,935,504 | A | 8/1999 | Bienick et al. |
| 6,019,929 | A | 2/2000 | Noggle et al. |
| 6,120,274 | A | 9/2000 | Gerig et al. |
| 6,123,535 | A | 9/2000 | Ash et al. |
| 6,257,897 | B1 | 7/2001 | Kubota |
| 6,276,109 | B1 * | 8/2001 | Hingorani ............... B60R 13/04 52/716.5 |
| 6,363,900 | B1 | 4/2002 | Homi et al. |
| 6,368,448 | B1 | 4/2002 | Okamura et al. |
| 6,418,888 | B1 | 7/2002 | Narayanaswamy |
| 6,502,547 | B2 | 1/2003 | Kennedy et al. |
| 6,533,568 | B1 | 3/2003 | Kosicki |
| 6,772,484 | B2 | 8/2004 | Miyano et al. |
| 6,932,416 | B2 | 8/2005 | Clauson |
| 7,096,849 | B1 | 8/2006 | Mathis et al. |
| 7,165,371 | B2 * | 1/2007 | Yoyasu ................... B60R 13/04 52/716.5 |
| 7,534,134 | B2 | 5/2009 | Qiu |
| 7,556,007 | B2 | 7/2009 | Nicholas et al. |
| 7,837,248 | B2 | 11/2010 | Nedelman |
| 8,113,475 | B2 | 2/2012 | Whittemore et al. |
| 8,272,675 | B2 | 9/2012 | Fowler et al. |
| 8,474,845 | B2 | 7/2013 | Souschek et al. |
| 8,628,139 | B2 | 1/2014 | van Oirschot et al. |
| 8,671,528 | B2 * | 3/2014 | Hayashi ............... F16B 21/086 24/297 |
| 8,877,113 | B2 * | 11/2014 | Ishizu ..................... F16B 2/20 264/318 |
| 8,939,745 | B2 | 1/2015 | Fox et al. |
| 9,326,053 | B2 | 4/2016 | Nedelman |
| 9,463,831 | B2 * | 10/2016 | Morris .................. B62D 27/065 |
| 9,551,307 | B1 | 1/2017 | Hamzeh et al. |
| 9,669,770 | B1 * | 6/2017 | Schlaupitz ............ F16B 21/073 |
| 9,919,743 | B2 | 3/2018 | Schmidt et al. |
| 10,065,571 | B1 | 9/2018 | Ajami et al. |
| 10,093,268 | B2 | 10/2018 | Cowelchuk et al. |
| 10,208,720 | B2 | 2/2019 | Tachikawa |
| 10,876,559 | B2 * | 12/2020 | Weber ...................... B62J 17/00 |
| 2001/0040313 | A1 | 11/2001 | Cesano |
| 2002/0084122 | A1 | 7/2002 | Emori et al. |
| 2002/0088423 | A1 | 7/2002 | Minegishi et al. |
| 2002/0151210 | A1 | 10/2002 | Singh et al. |
| 2002/0174532 | A1 | 11/2002 | Skov et al. |
| 2003/0169522 | A1 | 9/2003 | Schofield et al. |
| 2004/0154574 | A1 | 8/2004 | Menin |
| 2004/0178660 | A1 | 9/2004 | Dry |
| 2004/0194750 | A1 | 10/2004 | Tanikawa et al. |
| 2004/0200450 | A1 | 10/2004 | Tanikawa et al. |
| 2005/0005890 | A1 | 1/2005 | Asfaw et al. |
| 2005/0022771 | A1 * | 2/2005 | Cicone ............. F02M 35/10347 123/184.21 |
| 2005/0227042 | A1 | 10/2005 | Cowelchuk et al. |
| 2005/0227043 | A1 | 10/2005 | Schoemann et al. |
| 2005/0274452 | A1 | 12/2005 | Schoemann et al. |
| 2005/0279892 | A1 | 12/2005 | Kovac et al. |
| 2006/0072917 | A1 | 4/2006 | Miyazaki et al. |
| 2006/0117535 | A1 * | 6/2006 | Fraser ................. B60R 13/0206 24/289 |
| 2007/0107174 | A1 * | 5/2007 | Bordas .................. F16B 5/0657 24/664 |
| 2007/0141193 | A1 | 6/2007 | Suga |
| 2007/0210616 | A1 | 9/2007 | Wenzel et al. |
| 2008/0054522 | A1 | 3/2008 | Summerer |
| 2008/0079191 | A1 | 4/2008 | Nishida |
| 2008/0211137 | A1 | 9/2008 | Schilles |
| 2009/0145042 | A1 | 6/2009 | Mieglitz et al. |
| 2010/0003464 | A1 | 1/2010 | Kitajima et al. |
| 2010/0031912 | A1 | 2/2010 | Rolland et al. |
| 2010/0040720 | A1 | 2/2010 | Nakagawa et al. |
| 2010/0078842 | A1 | 4/2010 | Mellander |
| 2010/0155981 | A1 | 6/2010 | Miyabe et al. |
| 2010/0229821 | A1 | 9/2010 | Decker et al. |
| 2010/0244317 | A1 | 9/2010 | Andersson |
| 2010/0288247 | A1 | 11/2010 | Tanikawa et al. |
| 2011/0035909 | A1 * | 2/2011 | Moberg ................. B60J 5/0468 296/1.08 |
| 2011/0115117 | A1 | 5/2011 | Desmith et al. |
| 2011/0169186 | A1 | 7/2011 | Bruman et al. |
| 2011/0221091 | A1 | 9/2011 | Lapadula et al. |
| 2012/0110796 | A1 | 5/2012 | Klein et al. |
| 2012/0200097 | A1 | 8/2012 | Seto et al. |
| 2012/0204982 | A1 | 8/2012 | Lyle |
| 2012/0238150 | A1 | 9/2012 | Sakamoto et al. |
| 2012/0257924 | A1 * | 10/2012 | Andrews ............... F16B 21/086 403/381 |
| 2012/0301568 | A1 | 11/2012 | Hirth et al. |
| 2012/0319427 | A1 | 12/2012 | Larcom et al. |
| 2013/0039694 | A1 | 2/2013 | Hampel |
| 2013/0078403 | A1 | 3/2013 | Kano |
| 2013/0273191 | A1 | 10/2013 | Dooley |
| 2013/0277886 | A1 | 10/2013 | Fujiwara et al. |
| 2013/0320742 | A1 | 12/2013 | Murolo et al. |
| 2014/0216386 | A1 | 8/2014 | Shinkai et al. |
| 2014/0241830 | A1 | 8/2014 | Korn |
| 2014/0311143 | A1 | 10/2014 | Speidel et al. |
| 2014/0367888 | A1 | 12/2014 | Kubo |
| 2014/0374564 | A1 | 12/2014 | Schroeder et al. |
| 2014/0374957 | A1 * | 12/2014 | Liu ......................... B29C 45/33 425/457 |
| 2015/0078817 | A1 | 3/2015 | Yamauchi |
| 2015/0114335 | A1 | 4/2015 | Yamaguchi et al. |
| 2015/0125200 | A1 | 5/2015 | Garay et al. |
| 2015/0211274 | A1 * | 7/2015 | Tanabe ..................... E05D 5/062 16/250 |
| 2015/0266429 | A1 | 9/2015 | Rapa, Jr. et al. |
| 2015/0283955 | A1 | 10/2015 | Sakamoto et al. |
| 2015/0291012 | A1 | 10/2015 | Gillay et al. |
| 2015/0367550 | A1 | 12/2015 | Luepke et al. |

(56) References Cited

U.S. PATENT DOCUMENTS

| | | |
|---|---|---|
| 2016/0061167 A1* | 3/2016 | Senda .................. F02M 35/104 123/184.21 |
| 2016/0082630 A1 | 3/2016 | Bazinski et al. |
| 2016/0115918 A1 | 4/2016 | Kulkarni et al. |
| 2016/0169171 A1 | 6/2016 | Newman et al. |
| 2017/0001350 A1 | 1/2017 | Ahn |
| 2017/0066166 A1 | 3/2017 | Park et al. |
| 2017/0113625 A1 | 4/2017 | Schmalzrieth et al. |
| 2017/0182729 A1 | 6/2017 | Fox et al. |
| 2017/0248162 A1 | 8/2017 | Gruhler et al. |
| 2017/0291556 A1 | 10/2017 | Mizota et al. |
| 2017/0302062 A1 | 10/2017 | Richardson et al. |
| 2017/0348918 A1 | 12/2017 | Barrenscheen |
| 2018/0087553 A1* | 3/2018 | Dobbs ..................... F16B 21/09 |
| 2018/0093399 A1 | 4/2018 | Erb et al. |
| 2018/0094662 A1* | 4/2018 | Compton ................ F16B 12/10 |
| 2018/0142609 A1 | 5/2018 | Seo et al. |
| 2018/0215081 A1 | 8/2018 | Arima et al. |
| 2018/0229411 A1 | 8/2018 | Aquilina et al. |
| 2018/0266372 A1* | 9/2018 | Schallauer .............. B29C 65/06 |
| 2018/0345548 A1 | 12/2018 | Ngem et al. |
| 2018/0370457 A1 | 12/2018 | Minard et al. |
| 2019/0061651 A1 | 2/2019 | Takahashi et al. |

\* cited by examiner

VEHICLE COMPONENT WITH AN ACCESSORY MOUNTING FEATURE AND A METHOD AND TOOL FOR FORMING

CROSS-REFERENCE TO RELATED APPLICATIONS

This application is a division of U.S. application Ser. No. 15/887,202 filed Feb. 2, 2018, issued as U.S. Pat. No. 10,808,657, the disclosure of which is hereby incorporated in its entirety by reference herein.

TECHNICAL FIELD

Various embodiments relate to a vehicle component with an accessory mounting feature, and a method and tool for forming the vehicle component.

BACKGROUND

Vehicle components may include various mounting features for accessories or other secondary vehicle components. An example of such a vehicle component is an intake manifold with a mounting point for a wiring harness. The vehicle component may be formed using a tool assembly or mold, and the tool or mold may be designed with a certain number of tools or slides. The mounting feature may be provided on the vehicle component to locate and position the secondary vehicle component in a prescribed manner. Shape or tool path interferences may lead to the mounting feature being unable to be formed by the existing tool while maintaining a maximum wall thickness for the component such that an additional slide would need to be added to the tool, leading to an increase in complexity and costs related to the tooling.

SUMMARY

In an embodiment, a method of forming a vehicle component is provided. First and second tools are formed with first and second surfaces, respectively. The first tool is translated along a first axis towards the second tool such that the first and second surfaces cooperate to define a mold cavity configured to form an accessory mount feature with an aperture. The second surface is configured to form an integrated rib extending outwardly from an upper surface of the mount feature to a planar bearing surface surrounding the aperture. The first axis is oriented at an acute angle relative to the planar bearing surface and is substantially parallel to the upper surface.

In another embodiment, a mold is provided with a first tool configured to translate along a first axis and defining a first surface, and a second tool defining a second surface. The first and second surfaces define a mold cavity configured to form a mount feature on a vehicle component. The second surface is configured to form a planar bearing surface surrounding an aperture of the feature, and the first axis is oriented at an acute angle relative to the planar bearing surface.

DETAILED DESCRIPTION

As required, detailed embodiments of the present disclosure are provided herein; however, it is to be understood that the disclosed embodiments are merely exemplary and may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present disclosure.

Figure 1:
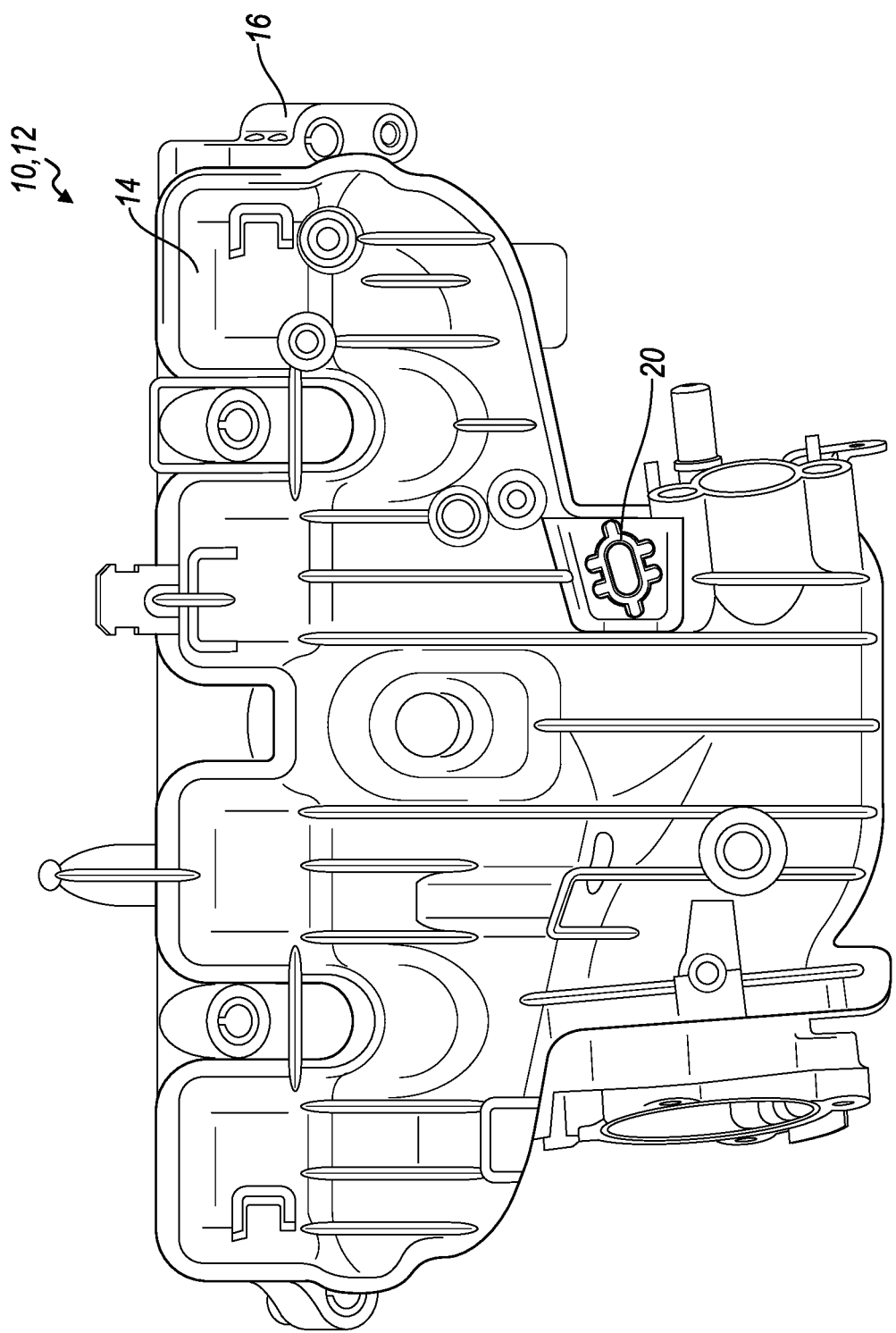
FIG. 1 illustrates a perspective view of a vehicle component according to an embodiment.
Figure 2:
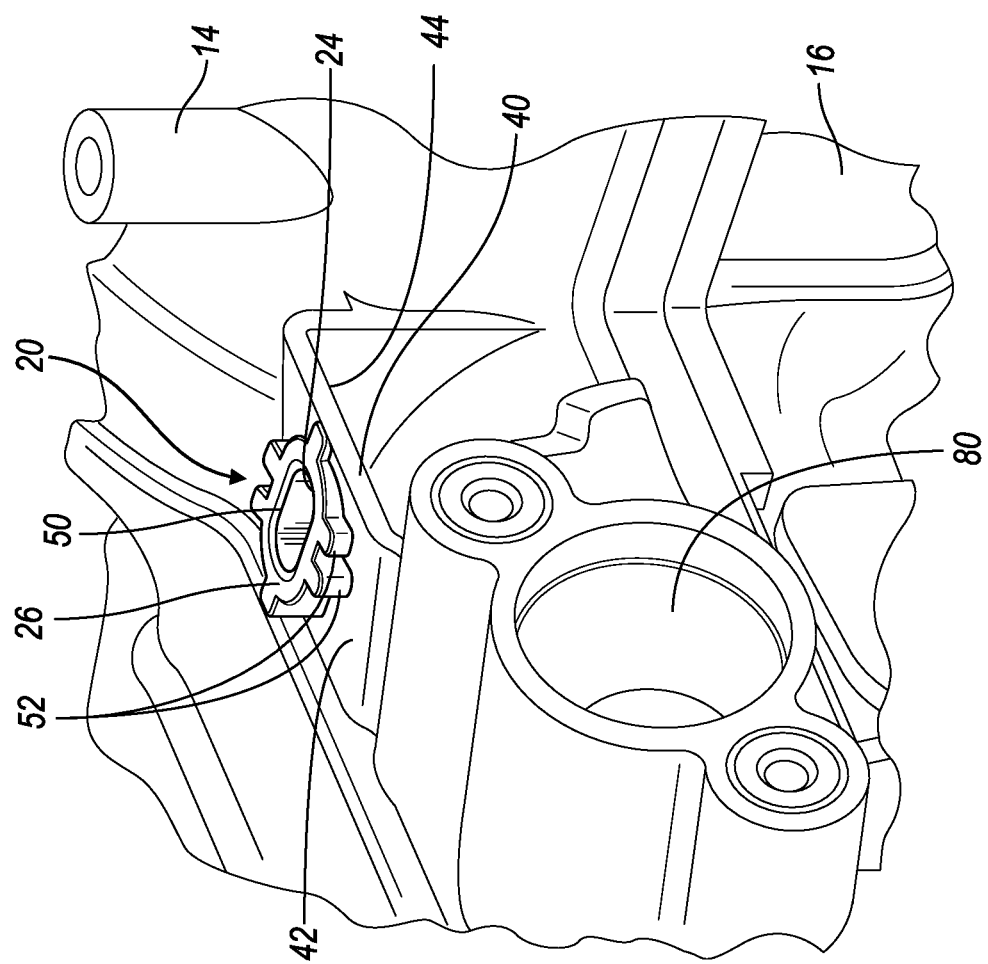
FIG. 2 illustrates a partial perspective view of the vehicle component of FIG. 1.
Figure 3:
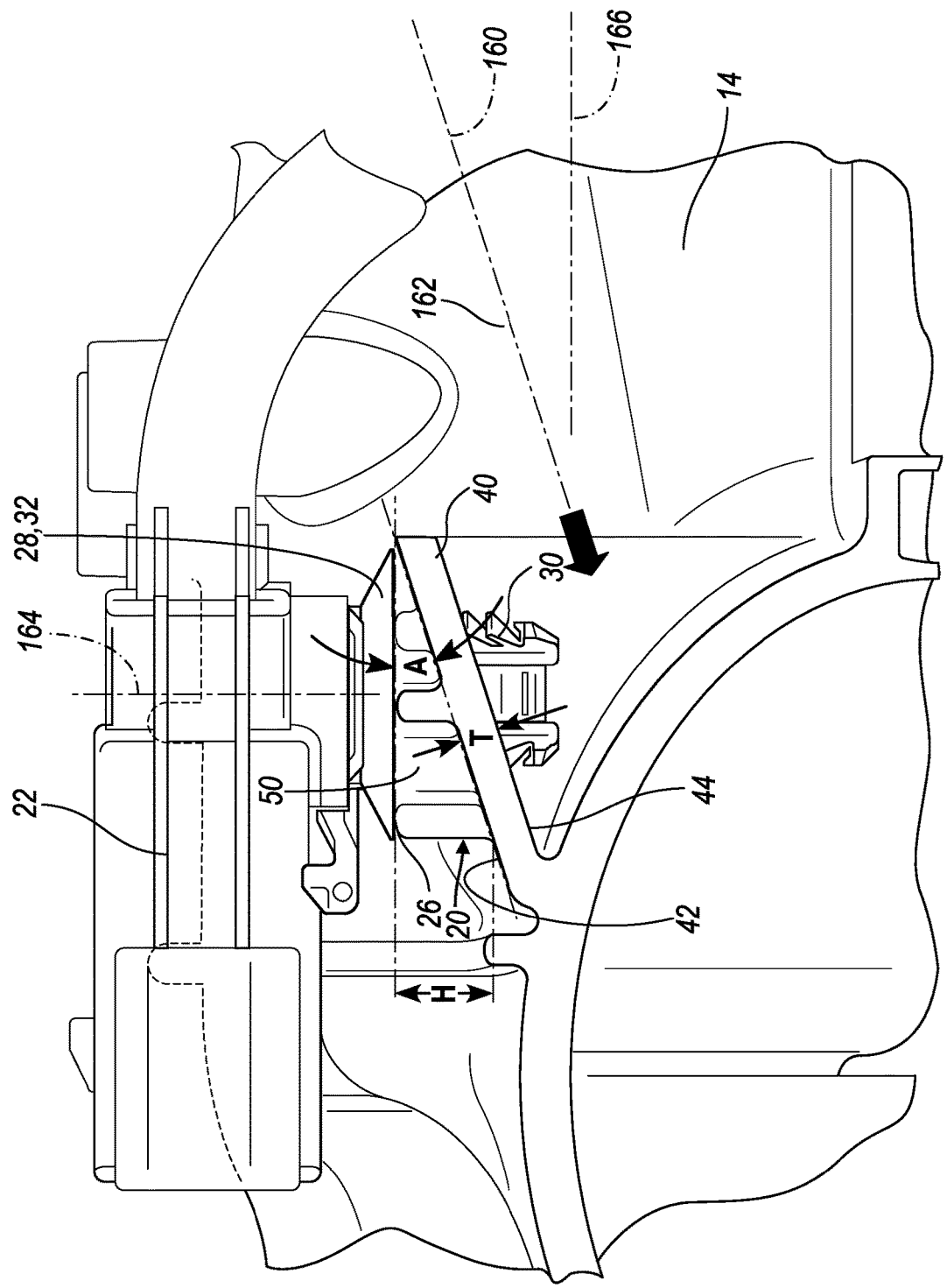
FIG. 3 illustrates a partial sectional view of the vehicle component of FIG. 1 with an accessory mounted thereto.

FIGS. 1-3 illustrate a vehicle component 10 according to an embodiment. The vehicle component 10 shown is an intake manifold 12 for an internal combustion engine or a portion thereof. In other embodiments, the vehicle component 10 may be a battery tray, an engine cam cover, or the like.

The intake manifold 12 has a first shell portion 14 and a second shell portion 16 that cooperate to form the intake manifold. Each shell portion 14, 16 may be molded from a polymer material, a plastic material, or a composite material, including a fiber or particle reinforced resin, as described in further detail below. The disclosure is not limited to the composite materials and forming processes included herein, and additional materials and processes may be used according to the spirit and scope of the disclosure. In one example, each shell portion 14, 16 is formed using an injection molding process in a tool assembly or mold. In other examples, the shell portion(s) 14, 16 may be formed in a blow molding, compression molding, or other process that involves a tool assembly with multiple tool, slide, and/or die components.

The vehicle component 10 provides one or more mounting features 20 for an accessory 22. In one example, the mounting feature 20 is an aperture 24 and planar bearing surface 26 for a clip fastener 28. The clip fastener 28 has a post section 30 or post, and a head section 32, or head. The post section 30 may be inserted into the aperture 24 such that it extends into the aperture 24, and may additionally be provided with retention features to retain the fastener 28 to the mounting feature 20. The post section 30 may be inserted into the aperture 24 until the head section 32 is in contact with or abuts the planar bearing surface 26. The bearing surface 26 therefore provide a support surface for the head section 32 of the fastener 28, and the mounting feature 20 locates and orients the fastener 28 and accessory 22 relative to the vehicle component 10.

The head section 32 of the fastener 28 may be provided with one or more clamp devices, cable ties, or other features that allow for connection of the accessory 22 to the fastener. In one example, and as shown, the accessory 22 is a wiring harness.

In other examples, other fasteners 28 and mounting features 20 may be provided in various embodiments and according to the present disclosure and may be at least in part based on the vehicle accessory 22 to be mounted.

The planar bearing surface 26 of the mounting feature 20 is required to be provided at a predetermined location relative to the component 10, and at a predetermined orientation or angle on the component, in order to locate the fastener 28 and associated accessory 22 relative to the component 10. In one example, the accessory 22 is a wiring harness, and the planar bearing surface 26 is provided to locate the harness 22 such that the harness has clearance relative to the component 10, for example, as the cable or wires runs alongside the component. In the example shown, the mounting feature 20 and the clip fastener 28 cooperate to position the wire harness 22 such that it extends at a desired angle above the planar bearing surface and longitudinally along the shell 14.

The mounting feature 20 may be provided as a mounting box or other flange or similar extension from the shell 14 of the component 10 to provide the planar bearing surface 26 at the desired location and angle.

In one example, and as shown, the vehicle component 10 has a body 14 that is formed by a shell structure. The body 14 has a mounting feature 20 that is integrally formed with the body. The mounting feature 20 includes a member 40 such as a plate that extends outwardly from the shell 14. The member plate 40 has a first surface 42, or upper surface. The member also has a second surface 44, or lower surface. The upper and lower surfaces 42, 44 may be opposite to one another and spaced apart from one another. The upper and lower surfaces 42, 44 may additionally be substantially parallel to one another and follow one another as shown. For purposes herein, "substantially" with respect to an angular relationship refers to a variability of five degrees or less, and may provide for tooling draft clearance, and the like.

An aperture 24 extends through the member 40 and intersects the upper and lower surfaces 42, 44. The upper and lower surfaces 42, 44 may each surround the aperture 24. The aperture 24 may be provided with various shapes based on the fastener 28 planned for use with the mounting feature 20. An integrated rib 50 extends outwardly from the upper surface 42 to a planar bearing surface 26, with the planar bearing surface 26 and integrated rib 50 surrounding the aperture 24. The planar bearing surface 26 may be oriented at a nonperpendicular and nonparallel angle relative to the upper and lower surfaces 42, 44. The planar bearing surface 26 may be further oriented at an acute angle A relative to the upper and lower surfaces 42, 44.

The integrated rib 50 may be provided by a tubular structure. The tubular rib structure may be further provided with a series of longitudinal secondary ribs 52 extending outwardly therefrom. Each secondary rib 52 may extend from the upper surface 42 to the planar bearing surface 26, and may provide additional structural support for the integrated rib 50 and planar bearing surface 26, as well as increasing the overall surface area of the planar bearing surface 26. The series of ribs 52 may include any number of ribs, including one or more, and the number of ribs 52 may be increased to increase the overall bearing surface area or as needed for stiffness or structural support.

Issues may arise when manufacturing the component 10 based on the location and orientation of the mounting flange 20 and desired bearing surface 26. For example, the component 10 may be formed by a tool assembly as described below, and the tools, dies, and slides may be provided and configured for movement based on the major features of the shell 14 itself. Depending on the positioning of the mounting flange and bearing surface, the existing tooling for forming the shell 14 may be incapable of additionally forming the mounting feature, e.g. based on interferences caused between the mounting feature surfaces and the slide paths. In conventional tooling systems, an additional slide would be required to form the mounting feature, which adds complexity to the tooling as well as cost.

Figure 5:
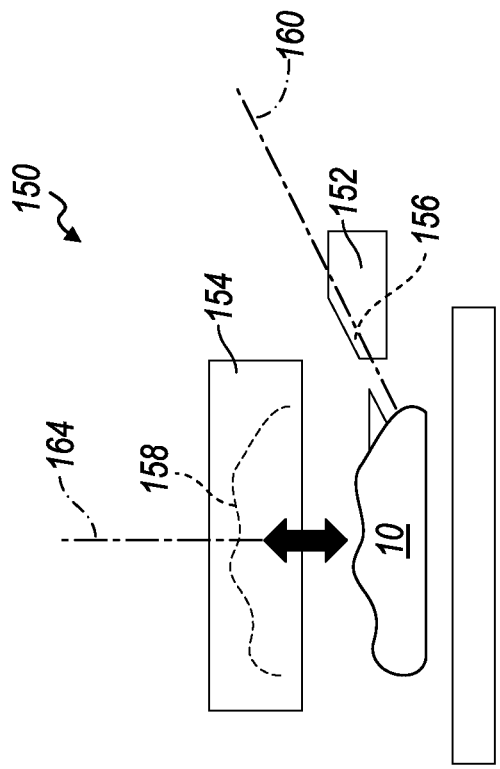
FIG. 5 illustrates a schematic of a tool assembly or mold for forming a vehicle component according to an embodiment.
Figure 4:
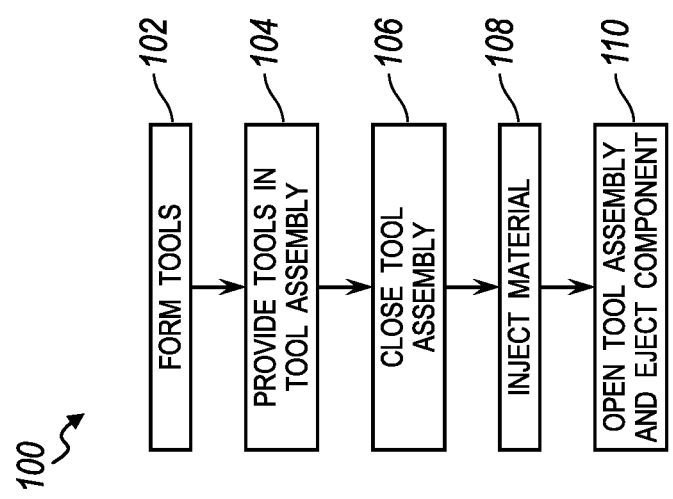
FIG. 4 illustrates a flow chart of a method for forming the vehicle component according to an embodiment.

FIG. 4 illustrates a process or method 100 of forming a vehicle component according to the present disclosure. FIG. 5 illustrates a tool assembly or a mold 150 for use with the method 100. The mold 150 is described with respect to forming a shell 14 of an intake manifold 12 with an accessory mounting feature 20, although the process and a tool to provide similar features may be applied to other vehicle components as described above. The method may include greater or fewer steps than shown, the steps may be rearranged in another order, and various steps may be performed serially or simultaneously according to various examples of the disclosure.

The mold 150 has a first tool 152 and a second tool 154. The mold 150 may have additional dies, slides or other components to form other regions of the vehicle component 10. The tools and dies 152, 154 may be formed from tool steel or another suitable material for repetitive use. The tools may be provided as die slides such that they assemble and mate with one another to form the tool assembly or mold with surface(s) for forming the vehicle component. Each die may be a cover die or an ejector die that cooperates with the other dies to form a mold cavity to form the vehicle component. In one example, the tool assembly or mold is provided for an injection molding process, for example, of a composite material, a polymer material, a thermoset material, a thermoplastic material, and the like.

At step 102, a first tool 152 is formed with a first surface 156, such as a molding surface. A second tool 154 is formed with a second surface 158, such as a molding surface. The first and second surfaces 156, 158 cooperate with one another to form a mold cavity when the tool assembly 150 is in a closed configuration. The mold cavity is configured to form an accessory mount feature 20 with an aperture 24. The first and second tool surfaces 156, 158 may additionally be configured to form other portions of the vehicle component, e.g. portions of the shell 14 of the intake manifold 12.

The first surface 156 is configured to form a lower surface 44 of the mount feature 20 surrounding the aperture 24. The second surface 158 is configured to form an integrated rib 50 extending outwardly from an upper surface 42 of the mount feature 20 to a planar bearing surface 26 surrounding the aperture 24 with the planar bearing surface 26 oriented at an acute angle A relative to the upper surface 42. The lower surface 44 is substantially parallel to and spaced apart from the upper surface 42.

The second surface 158 may be further configured to form the integrated rib 50 as a tubular structure extending outwardly from the upper surface 42 of the mount feature to the planar bearing surface 26. The second surface 158 may be further configured to provide the tubular rib structure 50 with a series of longitudinal secondary ribs 52 extending outwardly therefrom. Each secondary rib 52 may extend from the upper surface 42 to the planar bearing surface 26, and may provide additional structural support for the integrated rib 50 and planar bearing surface 26, as well as increasing the overall surface area of the planar bearing surface 26. The series of secondary ribs 52 may include any number of ribs, including one or more, and the number of ribs may be increased to increase the overall bearing surface area.

At step 104, the first and second tools 152, 154 are provided in a tool assembly 150, and the tool assembly is operated and controlled to form a component. At step 106, the first tool 152 is translated along a first axis 160 towards the second tool 154. The first axis is substantially parallel to the upper surface 42 and the lower surface 44. The first axis 160 is oriented at an acute angle A relative to the resulting planar bearing surface 26. The first axis may be defined for the tool based on other surfaces of the component or shell, for example, adjacent port or passage 80.

As the first tool 152 is translated along the first axis 160 towards the second tool 154 in a first direction 162, a height H of the integrated rib 50 of the resulting mounting feature as measured between the planar bearing surface 26 and the upper surface 42 continually increases in the first direction. Likewise, a distance between the planar bearing surface 26 and the lower surface 44 increases in the first direction 162.

The mold cavity formed by the first and second surfaces 156, 158 of the first and second tools 152, 154 defines the entirety of the accessory mounting feature 20 such that the mounting feature is formed without the use of a third tool despite the geometry. Therefore, as can be seen from the Figures, a conventional tool assembly would be otherwise provided with a third tool along a third axis 166 in order to form a mounting box for the desired bearing surface 26, and to maintain a maximum wall thickness T of the component. For the component 10 shown, the maximum wall thickness T is in the range of 3-4 millimeters, and having thicker regions than this may lead to molding and resulting component issues, for example, porosity issues. In other examples, other maximum wall thicknesses may be provided based on the injected material, tool assembly, and other considerations. The method 100 and tool 150 according to the present disclosure allows for the use of existing tooling to provide a mounting feature with the desired positioning for the bearing surface 26 while maintaining a predetermined maximum wall thickness T for the component.

The second tool 154 is translated along a second axis 166 towards the first tool 152, such that the first and second tools 152, 154 converge to close the tool assembly 150 and form the mold cavity in preparation for an injection process. The second axis 164 is nonparallel and nonperpendicular to the first axis 160. The second axis 164 is perpendicular to the planar bearing surface 26 according to one example. The first and second tools 152, 154 may be moved simultaneously, or one after the other. In further examples, only one of the first and second tools 152, 154 is moved, and the other remains fixed to a bed of the tool assembly 150.

When the tool assembly 150 is closed, material is injected or otherwise into the mold cavity to form the component 10 at step 108. In one example, the material includes a polymer material, a plastic material, or the like. In another example, the material is a composite material. The injection process may occur at a high pressure, and the tool assembly 150 may be heated and/or cooled as a part of the process to set the injected material. The material is injected and flows into the mold cavity of the tool assembly and into contact with the surfaces tools and dies.

After injecting material, the tool assembly 150 remains closed for a predetermined time to allow the formed component 10 to cool within the mold. At step 110, the tool assembly 150 is then opened, for example, by translating the first tool 152 and second tool 154 away from one another by translating the first tool 152 along the first axis 160 and translating the second tool 152 along the second axis 164. The component 10 may then be ejected or removed from the tool assembly 150. The tool assembly or mold 150 therefore provides a vehicle component 10, such as the intake manifold 12 of FIG. 1, with a shell 14 and an accessory mounting feature 20 with a plana bearing surface 26 at a predetermined angle without changing the side areas or adding another slide or tool.

While exemplary embodiments are described above, it is not intended that these embodiments describe all possible forms of the disclosure. Rather, the words used in the specification are words of description rather than limitation, and it is understood that various changes may be made without departing from the spirit and scope of the disclosure. Additionally, the features of various implementing embodiments may be combined to form further embodiments of the invention.

What is claimed is:

1. An intake manifold comprising:
a shell structure forming at least a portion of a body of the intake manifold, the shell structure having an accessory mount feature integrally formed with the shell structure and extending outwardly therefrom, the accessory mount feature defining an aperture therethrough, the shell structure defining an integrated rib extending outwardly from an upper surface of the mount feature to a planar bearing surface surrounding the aperture, the planar bearing surface oriented at a nonparallel and nonperpendicular angle relative to the upper surface of the mount feature;
wherein the integrated rib is formed by a tubular structure surrounding the aperture and extending outwardly from the upper surface to the planar bearing surface;
wherein the tubular structure defines a series of longitudinal secondary ribs extending outwardly therefrom; and
wherein an end of each secondary rib forms a portion of the planar bearing surface.

2. The intake manifold of claim 1 wherein the nonparallel and nonperpendicular angle is an acute angle.

3. The intake manifold of claim 1 wherein the mount feature is formed by a flange extending outwardly from the shell, the flange having the upper surface and a lower surface surrounding the aperture such that the aperture intersects both the upper and lower surfaces.

4. The intake manifold of claim 3 wherein the lower surface is substantially parallel to and spaced apart from the upper surface.

5. The intake manifold of claim 1 wherein each secondary rib extends from the upper surface to the planar bearing surface.

6. The intake manifold of claim 1 wherein the mount feature has a lower surface surrounding the aperture, the lower surface substantially parallel to and spaced apart from the upper surface.

7. The intake manifold of claim 1 wherein the shell comprises at least one of a polymer and a plastic.

8. The intake manifold of claim 1 wherein a height of the integrated rib as measured between the planar bearing surface and the upper surface continually increases in a transverse direction across the planar bearing surface.

9. An intake manifold assembly comprising:
an intake manifold according to claim 1; and
a clip fastener for a wire harness, the clip fastener having a post received by the aperture and a head in contact with the planar bearing surface.

10. The intake manifold assembly of claim 9 further comprising the wire harness attached to the head of the clip fastener such that the mounting feature and the clip fastener cooperate to position the wire harness to extend in parallel above the planar bearing surface.

11. The intake manifold of claim 1 formed by a process comprising:
  forming first and second tools with first and second surfaces, respectively, the first and second surfaces shaped to cooperate and define a mold cavity for forming the accessory mount feature, the second surface shaped to form the integrated rib extending outwardly from the upper surface of the mount feature to the planar bearing surface surrounding the aperture;
  translating the first tool along a first axis towards the second tool to form the mold cavity via the first and second surfaces, the first axis being substantially parallel to the upper surface; and
  injecting material into the mold cavity to form the shell structure with the accessory mount feature.

12. The intake manifold of claim 11 formed by the process further comprising translating the second tool along a second axis towards the first tool.

13. The intake manifold of claim 12 wherein the second axis is nonparallel and nonperpendicular to the first axis.

14. The intake manifold of claim 12 wherein the second axis is perpendicular to the planar bearing surface.

15. An intake manifold comprising:
  a shell structure forming at least a portion of a body of the intake manifold, the shell structure having an accessory mount feature integrally formed with the shell structure and extending outwardly therefrom, the accessory mount feature defining an aperture therethrough, the shell structure defining an integrated rib extending outwardly from an upper surface of the mount feature to a planar bearing surface surrounding the aperture, the planar bearing surface oriented at a nonparallel and nonperpendicular angle relative to the upper surface of the mount feature;
  wherein a height of the integrated rib as measured between the planar bearing surface and the upper surface continually increases in a transverse direction across the planar bearing surface.

16. The intake manifold of claim 15 wherein the nonparallel and nonperpendicular angle is an acute angle.

17. The intake manifold of claim 15 wherein the mount feature is formed by a flange extending outwardly from the shell, the flange having the upper surface and a lower surface surrounding the aperture such that the aperture intersects both the upper and lower surfaces.

18. The intake manifold of claim 15 wherein the integrated rib is formed by a tubular structure surrounding the aperture and extending outwardly from the upper surface to the planar bearing surface.

19. The intake manifold of claim 18 wherein the tubular structure defines a series of longitudinal secondary ribs extending outwardly therefrom.

20. The intake manifold of claim 15 wherein the shell comprises at least one of a polymer and a plastic.

* * * * *